United States Patent [19]

Hayden et al.

[11] Patent Number: 4,624,302

[45] Date of Patent: Nov. 25, 1986

[54] APPARATUS FOR PREHEATING PRINTED CIRCUIT BOARDS

[75] Inventors: John R. Hayden; Curtis L. Huetson, both of Denver, Colo.

[73] Assignee: AT&T Technologies, Inc., Berkeley Heights, N.J.

[21] Appl. No.: 626,793

[22] Filed: Jul. 2, 1984

[51] Int. Cl.[4] .................. H01L 23/40; F28F 13/00
[52] U.S. Cl. .................. 165/80.2; 165/185; 269/903; 361/234
[58] Field of Search .............. 165/80 R, 80 A, 80 B, 165/80 C, 80 D, 185; 118/724, 725, 728, 500; 269/903; 361/234; 165/80.1, 80.2, 80.3, 80.4, 80.5

[56] References Cited

U.S. PATENT DOCUMENTS

| | | | |
|---|---|---|---|
| 1,977,731 | 10/1934 | Masury | 165/185 |
| 2,365,670 | 12/1944 | Wallace | 165/185 X |
| 3,128,419 | 4/1964 | Waldkotter et al. | 165/185 X |
| 3,327,779 | 6/1967 | Jacoby | 165/185 |
| 4,102,152 | 7/1978 | Covault | 165/170 X |
| 4,104,508 | 8/1978 | Ebert | 219/521 |
| 4,189,630 | 2/1980 | Ebert | 219/354 |
| 4,226,281 | 10/1980 | Chu | 165/185 X |
| 4,235,283 | 11/1980 | Gupta | 165/185 X |
| 4,279,241 | 7/1981 | Himes | 165/185 X |
| 4,502,094 | 2/1985 | Lewin et al. | 361/234 |

Primary Examiner—Sheldon J. Richter
Attorney, Agent, or Firm—R. F. Kip, Jr.

[57] ABSTRACT

A heating device is disclosed wherein a printed circuit board is uniformly preheated before discrete electronic components are soldered onto the boards. The soldering process includes a reflow stage where the boards are subject to rapid temperature change causing internal heat stresses which warp the boards if they haven't been preheated. The device comprises a non-conductive body and conductive elements, such as steel staples, embedded in said body. The staples extend through both sides of said body making contact with a heating surface and supporting the printed circuit board which sits upon them. The staples are spaced and arranged so the components' electrical pins which extend beyond the bottom surface of the board pass into the bed of staples without interference. Therefore, heat is transferred from the heating surface directly to the board via the conducting staples in a uniform fashion.

1 Claim, 4 Drawing Figures

APPARATUS FOR PREHEATING PRINTED CIRCUIT BOARDS

TECHNICAL FIELD

This invention relates to the means for uniformly preheating printed circuit boards before discrete electronic components are soldered onto the boards.

BACKGROUND OF THE INVENTION

Discrete electronic components such as chip carriers are mounted on printed circuit boards by means of some type of soldering process. When such components need to be surface mounted (as opposed to inserted through holes in the board), a soldering technique utilizing solder reflow machines is introduced after the chip carriers have been mounted. Such machines blow hot air, at the solder melting temperature, via nozzles onto the top surface of the boards in order to smooth any globs or excess accumulations of solder. The reflow machines continue to heat the boards for a period of approximately 40 seconds.

It is during and after this reflow stage that a printed circuit board will experience internal heat stresses and undergo warping caused by the rapid temperature change due to the sudden exposure to the hot air and subsequent cooling. Before positioning and soldering a chip carrier onto the surface of a printed circuit board, the board must be preheated in order to prevent such warping.

Presently, the board is not uniformly heated since component leads, protruding from the lower surface of the board, do not permit the board to sit flat on the heating surface. Therefore, warping still occurs in the local areas of the board which were not heated properly. Secondly, the nozzle of a reflow machine, which makes contact with the printed circuit board during reflow, will not discharge hot air evenly upon the boards if it does not sit flat and is tilted in some manner.

SUMMARY OF THE INVENTION

The problems of present heating methods are obviated by the invention which is a device adapted to transfer heat from a heat source to an object, such as a printed circuit board, said device comprising a non-conductive body supporting a plurality of conductive elements, such as steel staples, lodged therein and extending through and beyond on opposite sides of said body. The conductive elements act as support for said object on one side and are adapted to directly contact said heat source on the other side.

Heat is uniformly transmitted through the conductive elements to the object. Where the object is a printed circuit board, any component leads protruding from the bottom surface of the board will be pushed into the bed of elements, spaced as to allow the board to lie flush on the heat-transmitting elements. This also insures that the board will not be tilted in any manner which would disrupt the hot air discharge from the reflow machine's nozzle.

BRIEF DESCRIPTION OF DRAWINGS

For a better understanding of the invention, reference is made to the following description of an exemplary embodiment thereof, and to the accompanying drawings wherein.

DESCRIPTION OF EMBODIMENT

Figure 1:
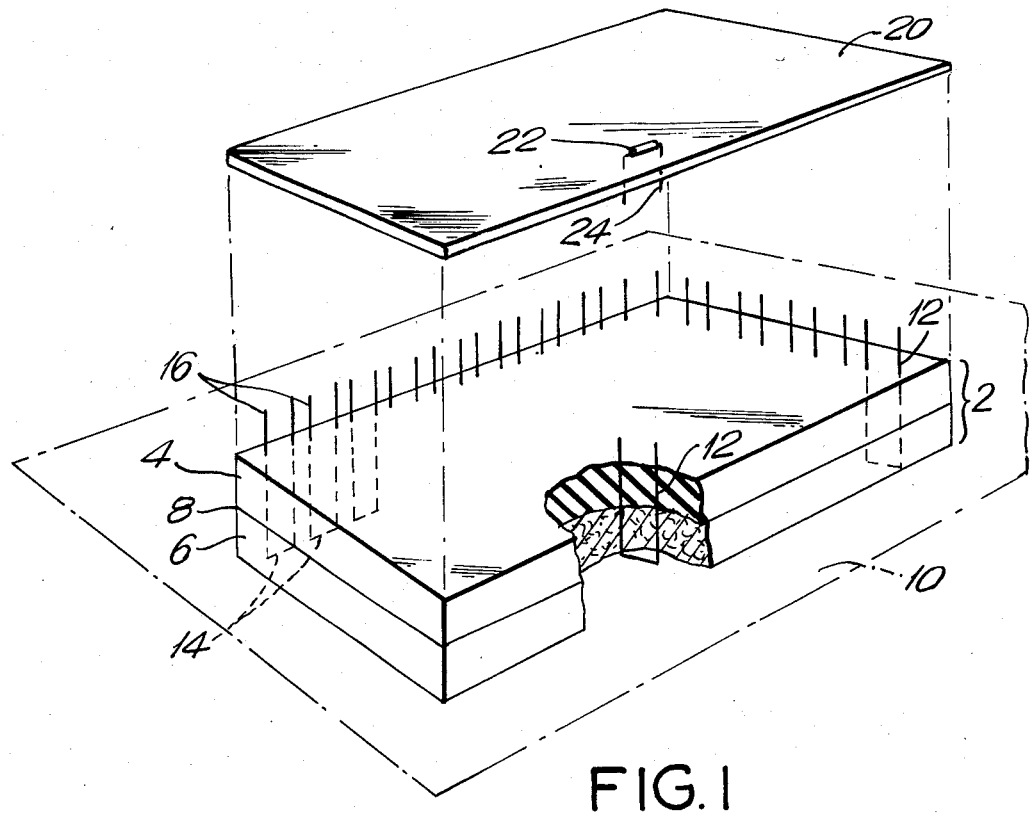
FIG. 1 is an isometric view of the apparatus and a printed circuit board, partially in cross-section.
Figure 2:
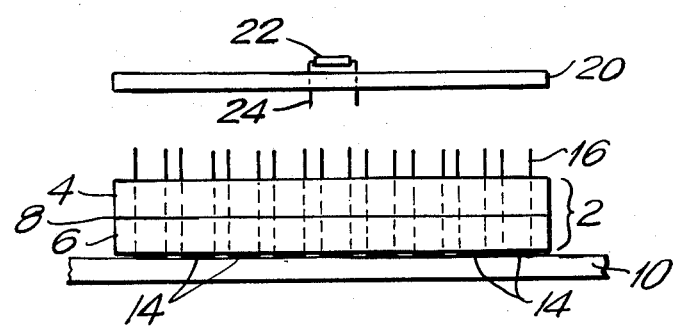
FIG. 2 is an enlarged front elevation view of the apparatus and a printed circuit board of FIG. 1.

As illustrated in FIGS. 1 and 2, the heating apparatus comprises a bed of U-shaped staples 12 embedded in a body 2 in a manner/pattern similar to that of filet clothing used in the garment industry.

Body 2 comprises an upper layer 4 of silicone rubber and a lower layer 6 of fiberglass which are bonded together by a heat resistance adhesive 8. Both rubber layer 4 and fiberglass layer 6 function to support and hold staples 12 in place. Both layers 4, 6 are made of materials which can resist the anticipated high temperatures, the specific materials chosen so as to allow the apparatus to be produced easily and inexpensively. The fiberglass layer 6 also acts to provide rigidity to body 2 so as to prevent any fortuitous bending thus insuring that a printed circuit board 20, body 2 and a heating surface 10 will be level with one another. The total thickness of body 2 is approximately 1/16".

Figure 3A:
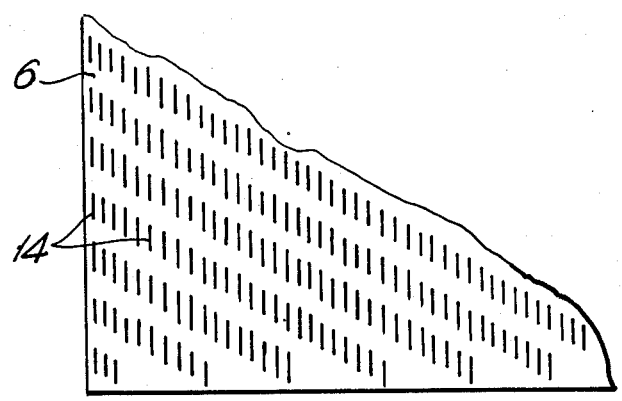
FIG. 3 is a partial top and bottom view of the filet arrangement of staples of the FIG. 1 apparatus.
Figure 3B:
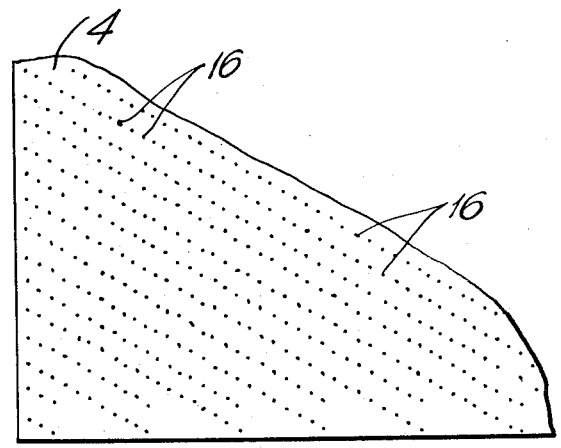

Staples 12 are thin (#28 AWG) plated wire staples shaped like the letter U whose lower portion has been squared and made of a metal such as steel which is both heat conducting and has compressive strength. Each staple 12 is approximately 7/16" long, the lower section 14 extending just beneath the lower surface of body 2 and the upper section 16, which consists of two tines, projecting 6/16" above the upper surface of body 2. The filet-like arrangement of staples 12, shown by FIGS. 3a and 3b, creates a spacing pattern which simulates a flat surface with respect to heating printed circuit board 20 while requiring only a minimum density of staples 12 to accomplish this "bed of nails" effect.

DESCRIPTION OF USAGE OF EMBODIMENT

In the use of the heating apparatus, body 2 is positioned on flat heating surface 10 such that section 14 of each staple 12 comes into contact with and is heated by surface 10. The air discharge temperature of a reflow machine (not shown) is approximately 250° F. Theoretically, the temperature heating surface 10 should be at least 250° F. so as to heat, via the staples, board 20 to the same temperature as the reflow air and thus prevent warping due to temperature changes. However, lower temperatures for heating surface 10 can be used without impairing this objective while at the same time maintaining a safety level for individuals at the workstation.

Heat from heating surface 10 is transmitted through staples 12 to printed circuit board 20 via conduction. The temperature of said heat is gradually increased till the desired level is reached. Uniform heating is established since board 20 lies flush on staples 12 and staples 12 are arranged in an ordered pattern, coextensive with board 20.

Once printed circuit board 20 is lowered onto heating apparatus 2. As board 20 is placed on the top sections 16 of staples 12, any component leads 24 extending down from the lower surface of board 20 pass into the bed of staples thus permitting board 20 to lie flush on staples 12. The spacing due to the filet arrangement of staples 12 allows leads 24 to pass by and in between staples 12 without interference.

After each chip carrier 22 has been individually soldered onto board 20, a solder reflow machine (not shown) is introduced to the workstation. The nozzle of said machine is placed over board 20 making contact at said board's surface perimeter. Since board 20 lies flush on staples 12, the nozzle also sits flat upon board 20 permitting the discharged air to be fully effective. Hot air is discharged at a temperature which causes all the solder to melt and redistribute evenly at each location on the top surface of board 20. The nozzle is removed and the solder is allowed to cool before being transfered from the workstation.

The heating apparatus 2, which transmitted heat before the soldering and reflow stages, can continue to heat wiring board 20 during those stages as well as during cooling, gradually reducing said board's temperature.

Note that since wiring board 20 is of non-conductive composition, the heat it receives from staples 12 is not further transmitted to either chip carriers 22 or the solder and, therefore, the former will not be damaged nor will the cooling or heating of the latter be disrupted.

What is claimed is:

1. In combination, heating means having a flat horizontal upwardly facing heating surface, a heat transfer device comprising a thermally nonconductive horizontal rigid base plate and a large plurality of elongated thermally-conductive vertical heating elements extending through and upwardly beyond said plate from bottoms of said elements on the underside of said plate to upper tips of said elements all lying in a common horizontal plane above said plate, said elements being fixedly supported in fixed alignment with each other by said plate and being distributed over the horizontal area of said plate so that their tips are arranged in said plane in a two-dimensional pattern of tips uniformly spaced in such pattern from each other, and said device being supported by said heating surface so that the bottoms of said elements abut and are in thermal contact with said surface, and a printed wiring board having electric circuit components on the top thereof and having leads of said components extending through said board to project downwardly beyond the bottom thereof, said board resting on said pattern of heating element tips with the downwardly projecting leads from said board being interspersed with ones of said elements to extend downward in the spaces therebetween so that said pattern of tips supports said board to be level to permit substantially uniform heating of all portions of said board by said elements.

* * * * *